United States Patent [19]

Chen

[11] 4,213,134
[45] Jul. 15, 1980

[54] CIRCUIT AND METHOD FOR THE RECORDER DISPLAY OF HIGH FREQUENCY PERIODIC SIGNALS

[75] Inventor: Chun-Fu Chen, North Canton, Ohio

[73] Assignee: The University of Akron, Akron, Ohio

[21] Appl. No.: 15,145

[22] Filed: Feb. 26, 1979

[51] Int. Cl.$^2$ ............... G01D 9/00; H03K 5/00; H03K 17/00; G01D 4/10
[52] U.S. Cl. ............... 346/1.1; 346/33 R; 307/353; 328/151; 364/483
[58] Field of Search ............ 346/1, 33 R; 307/353, 307/354; 328/151; 364/483, 486

[56] References Cited

U.S. PATENT DOCUMENTS

| | | | |
|---|---|---|---|
| 3,594,589 | 7/1971 | Hall | 307/353 |
| 3,753,133 | 8/1973 | Shumate, Jr. | 328/151 |
| 3,795,008 | 2/1974 | Kolsrud et al. | 346/33 R |
| 3,936,740 | 2/1976 | Hogg et al. | 364/555 X |
| 3,955,102 | 5/1976 | Chi | 307/354 |
| 4,019,146 | 4/1977 | Lesche | 328/151 |
| 4,069,447 | 1/1978 | Frye | 328/151 X |
| 4,073,009 | 2/1978 | Andow et al. | 364/483 X |
| 4,090,144 | 5/1978 | Jenik et al. | 307/354 X |
| 4,112,296 | 9/1978 | Heimbigner et al. | 307/353 X |

Primary Examiner—George H. Miller, Jr.
Attorney, Agent, or Firm—Hamilton, Renner & Kenner

[57] ABSTRACT

A circuit and method for the display of a high frequency periodic signal on a display (21) having a maximum response frequency less than the periodic signal frequency includes a signal period counter (12) for counting the number of periods in the high frequency periodic signal, a sampling control counter (16) for counting at a frequency substantially greater than the frequency of the high frequency periodic signal, and a comparator (17) for comparing the counts in the signal period counter (12) and the sampling control counter (16) and indicating a match thereof. When a match count is indicated, some electrical parameter of the high frequency periodic signal is sampled and held by a sample and hold circuit (20) until the next match count is indicated, thereby accurately reproducing the high frequency periodic signal at another frequency in a range of frequencies from zero up to and including the maximum response frequencies of the display.

13 Claims, 4 Drawing Figures

CIRCUIT AND METHOD FOR THE RECORDER DISPLAY OF HIGH FREQUENCY PERIODIC SIGNALS

TECHNICAL FIELD

The present invention relates generally to a circuit for the display of a high frequency periodic signal on a display having a maximum response frequency less than the periodic signal frequency. More particularly, the present invention relates to a circuit for the display in real time of a high frequency periodic signal on a strip chart recorder without the need for information storage devices.

BACKGROUND ART

Monitoring electrical signal parameters such as voltage, current, etc. and providing a permanent record thereof is either a necessity or highly desirable in countless technical fields. Frequently such monitoring must or should preferably be done in real time as the signal occurs. Electromechanical recording and displaying devices have been designed to fill this need at minimal expense.

Perhaps the least expensive and most readily commercially available of these devices is a strip chart recorder. A strip chart recorder is a device in which paper is moved past a printing mechanism, which also may move, for simultaneously recording one or more varying signals as a function of time. In many commonly available strip chart recorders the printing mechanism is at least one pen which is mechanically moved transversely across the paper as the paper is moved past the same.

Because of the inherently slow response time of such electromechanical mechanisms, strip chart recorders have a severely limited frequency response of from zero to at most approximately 150 Hz for nearly all commercially available units. Moreover, in order to obtain suitably legible waveforms at the higher frequencies within this limited frequency response range, the paper must move past the printing mechanism with ever increasing velocity, resulting in consumption of great quantities of paper and requiring more frequent replacement of the paper source.

One solution to the limited frequency response of inexpensive strip chart recorders has been to record higher frequency input signals with an analog FM recorder or to utilize a computer to digitize the input signal for subsequent storage. The recorded input signal may be reproduced at a slower rate within the response range of the strip chart recorder. Such solutions require further expensive equipment and prohibit the on-line recording of the input signals in real time.

Another approach is employed in sampling oscilloscope circuits manufactured by Tektronix, Inc. of Beaverton, Oregon and is discussed more fully in the book entitled *Sampling Oscilloscope Circuits* by John Mulvey and published by Tektronix, Inc. in 1970. This approach recognizes that, at least in so far as electrical signals originating from transducers for taking physical measurements is concerned, most such signals do not vary significantly in successive periods and that the occurrence or transient phenomena which appear for only a single cycle is rare. Moreover, where a transient event is of interest, such as in starting large motors, mechanical vibration analysis or temperature measurement, its duration frequently lasts for several seconds, over a large number of cycles, and any change normally occurs in the magnitude of the electrical signal, rather than that of the signal waveform.

Accordingly, the sampling oscilloscope approach recognized that a high frequency input signal may be reproduced at a lower frequency without significant loss of signal information by the repeated sampling of the high frequency input signal by an analog sampling circuit. By insuring that sampling occurs at a high repetition rate, an oscilloscope with a slowly responding trace may present the sampled values as a continuous waveform. However, the analog circuitry with which this "scaling down" or converting in frequency is achieved is both costly and complex. Moreover, as a result of the idiosyncracies of oscilloscopes, consecutive traces must begin their displays with the same sampling point, preventing sampling and resulting in loss of information for the period of time during which the oscilloscope returns to its initial sampling point.

DISCLOSURE OF INVENTION

It is, therefore, an object of the invention to provide an economical circuit and method for the display of a high frequency periodic signal on a display having a maximum response frequency less than the periodic signal frequency.

It is another object of the invention to provide a circuit and method for the real time display of a high frequency periodic signal, as above, on a strip chart recorder without any information storage devices such as tape recorders.

It is still another object of the invention to provide a circuit and method for the display of a high frequency periodic signal, as above, which incorporates a simple digital logic circuit and a sample and hold circuit for converting the high frequency periodic signal to one capable of direct display by and accurate reproduction on a strip chart recorder.

It is yet another object of the invention to provide a circuit and method for the display of a high frequency periodic signal, as above, in which the digital logic circuit controls the time of sampling by the sample and hold circuit, causing a preselectable number of samples to be continuously taken to produce each strip chart recorder output waveform.

These and other objects and advantages of the present invention over existing prior art forms will become more apparent and fully understood from the following description in conjunction with the accompanying drawings.

In general, a circuit for the display of a high frequency periodic signal on a display having a maximum response frequency less than the periodic signal frequency includes a signal period circuit receiving the high frequency periodic signal and providing an output signal corresponding to the number of periods in the same, a sample and hold circuit also receiving the high frequency periodic signal and periodically sampling and holding some electrical parameter of the high frequency periodic signal, the display receiving the periodically sampled electrical parameter, and a sampling control circuit counting at a frequency substantially greater than the frequency of the high frequency periodic signal and providing an output signal corresponding to its present count. A comparator is provided for continuously comparing the output signals from the signal period circuit and the sampling control circuit and providing an output signal upon the occurrence of a match thereof for enabling a new sample to be taken by the sample and hold circuit, thereby permitting the display to accurately reproduce the high frequency periodic signal at another frequency in a range of frequencies from zero up to and including the maximum response frequency of the display.

A method for the display of a high frequency periodic signal on a display having a maximum response frequency less than the periodic signal frequency, includes the steps of counting in a signal period counter the number of periods in the high frequency periodic signal, counting in a sampling control counter at a frequency substantially greater than the frequency of the high frequency periodic signal, and comparing the counts in the signal period counter and the sampling control counter and indicating a match thereof. When a match count is indicated, some electrical parameter of the high frequency periodic signal is sampled and held until the next match count is indicated, thereby accurately reproducing the high frequency periodic signal at another frequency in a range of frequencies from zero up to and including the maximum response frequency of the display.

PREFERRED EMBODIMENT FOR CARRYING OUT THE INVENTION

Figure 1:
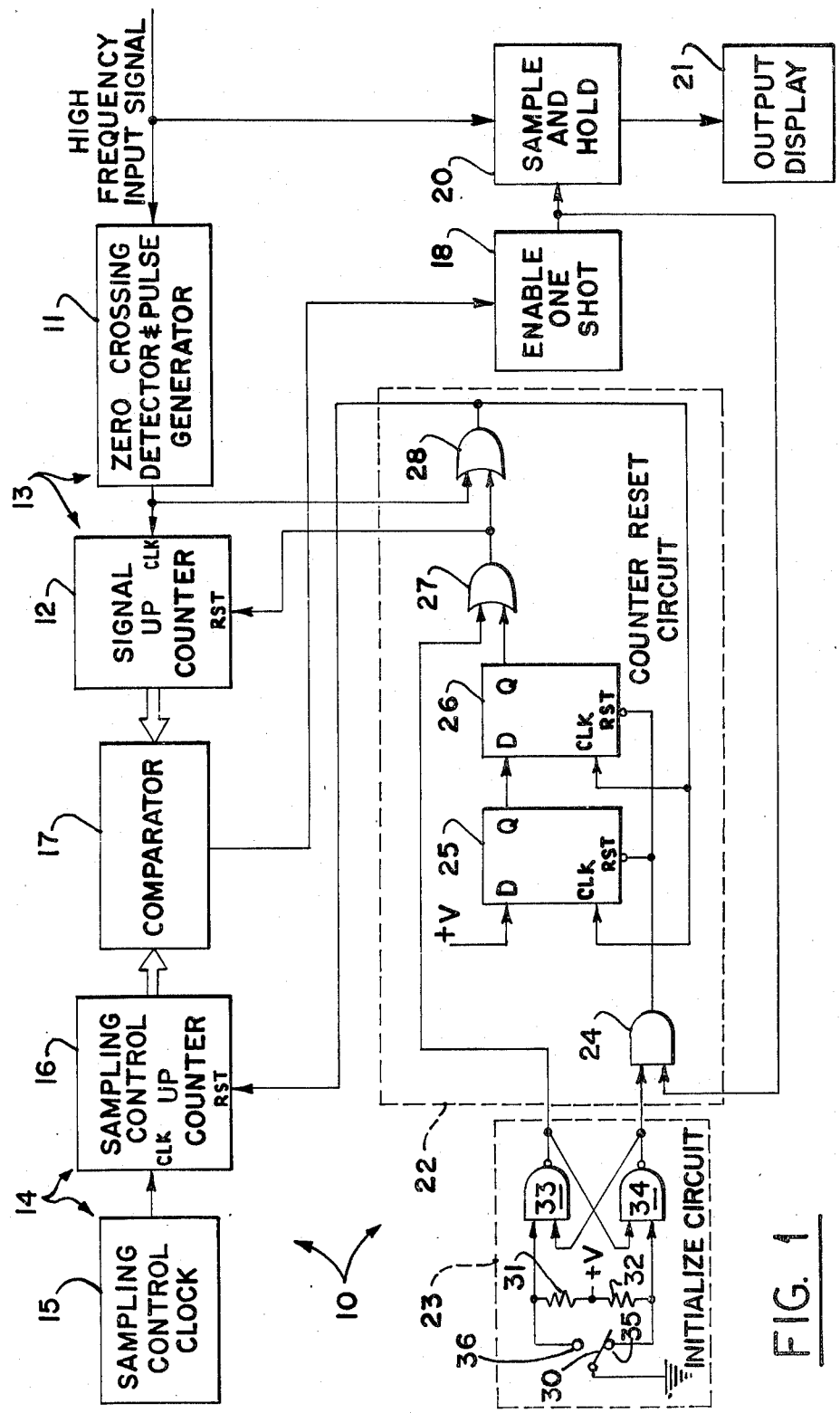
FIG. 1 is a block diagram of an exemplary circuit according to the concept of the present invention, and depicts initialize and counter reset circuits schematically.

FIG. 1 illustrates a circuit generally indicated by the numeral 10, which also embodies a method, for the display of a high frequency periodic signal on a display having a maximum response frequency less than the periodic signal frequency. Zero crossing detector and pulse generator 11 receives the high frequency periodic signal, indicated as the high frequency input signal in FIG. 1, and, together with signal up counter 12, may be considered a signal period determining and counting circuit 13.

Zero crossing detector and pulse generator 11 may include any of the conventional and well-known zero crossing detectors for providing a pulse output each time the high frequency input signal voltage crosses zero and has a slope of fixed sign (i.e., always positive or always negative). Provided the periodic high frequency input signal has only two zero crossings each cycle (one of positive and one of negative sign slope), zero crossing detector and pulse generator 11 will provide a single pulse output for each period in the high frequency input signal. In the event the high frequency input signal contains more than two zero crossings during each cycle, or in the event some point in the period other than the zero crossing is desired for utilization to determine each period, other well-known circuitry may be utilized to generate a signal indicative of the occurrence of each period in the high frequency input signal.

Signal up counter 12 may be any of the conventional and readily commercially available counters capable of counting either up or down from a presettable number and having suitable capacity to store a count equal to the greatest desired number of samples to be taken during a single period. A 16 bit up counter, resettable to zero, has been found to offer sufficient capacity for most work throughout the audio frequency spectrum and sufficient versatility to simplify the logic circuit configuration. Signal up counter 12 receives the pulse output from zero crossing detector and pulse generator 11 and is incremented from an initial zero count each time a pulse, which is indicative of the occurrence of a period, is received. Signal up counter 12 is reset by a signal in a manner to be discussed hereinbelow.

Sampling control circuit 14 is provided for controlling the time at which sampling of the high frequency input signal occurs and includes sampling control clock 15 and sampling control up counter 16. Sampling control clock 15 may be any conventional clock such as an astable multivibrator and preferably should provide a clock output signal having a clock frequency substantially greater than that of the maximum permissible frequency of the high frequency input signal, as will be indicated more particularly hereinafter. For reasons to be explained below, sampling control up counter 16, which receives the clock output signal from sampling control clock 15, must have sufficient capacity to count to a number one greater than the greatest desired number of samples to be taken during a single period, but otherwise may be identical to that of signal up counter 12. However, because counters are readily available in powers of some base number (such as base two for the binary logic system illustrated herein) the counter utilized for signal up counter 12 should always have sufficient additional bits to permit the same type of counter to be utilized for sampling control up counter 16. Sampling control up counter 16 is reset by a signal in a manner to be discussed hereinbelow.

The output count signals from both signal up counter 12 and sampling control up counter 16 are received by a comparator 17 which generates a high logic level output signal only when it detects an equal count or match between the count of the two counters. The output signal from comparator 17 is received by enable one-shot 18, which generates a single pulse output whenever comparator 17 detects a match count and thereby goes from a low to a high logic level output signal. The pulse output from enable one-shot 18 is received along with the high frequency input signal by sample and hold circuit 20, which samples any desired electrical parameter (such as voltage magnitude) of the high frequency input signal upon receipt of an enable pulse output, provides the sampled parameter as an output signal and holds the same until the next enable pulse output is received. Comparator 17, enable one-shot 18 (also referred to in the art as a monostable multivibrator), and sample and hold circuit 20 all are well-known devices for performing the above enumerated functions.

The sampled output signal from sample and hold circuit 20 is received and displayed by output display 21. Output display 21 may be any output display device whose response is relatively slow compared to that of the time between samples of the high frequency input signal by sample and hold circuit 20 such that the stepwise discontinuous output signal waveform from sample and hold circuit 20 appears continuous on output display 21. For example, where a permanent record of the high frequency input signal is desired, a strip chart recorder may be utilized as output display 21. Because of the inherently slow response time of electromechanical printing mechanisms such as that in a strip chart recorder, a new output signal will be received from sample and hold circuit 20 before its printing mechanism will have reached a steady state value, resulting in the output waveform from output display 21 appearing continuous.

Counter reset circuit 22 and initialize circuit 23 are provided to selectively reset both signal up counter 12 and sampling control up counter 16 at the appropriate times as later explained herein. Counter reset circuit 22 includes two-input AND gate 24, D-type flip-flops 25 and 26, and two-input OR gates 27 and 28. Both the output signal from enable one-shot 18 and one of two complementary output signals from initialize circuit 23 are received by AND gate 24, whose output is connected to the inverted reset terminals of both flip-flops 25 and 26. The D input to flip-flop 25 is connected to a high logic level signal of suitable voltage, for example, plus V volts herein. The D input to flip-flop 26 is connected to the Q output of flip-flop 25. The Q output of flip-flop 26 and the output signal from initialize circuit 23 not connected to AND gate 24 are both connected to OR gate 27, whose output is connected to both the reset terminal of signal up counter 12 and one of the two input terminals to OR gate 28. The remaining input terminal of OR gate 28 is connected to the output from zero crossing detector and pulse generator 11, while the output of OR gate 28 is connected to both the reset terminal of sampling control up counter 16 and the clock terminals of both flip-flops 25 and 26.

Initialize circuit 23 includes initialize/run switch 30, resistors 31 and 32, and two-input NAND gates 33 and 34. Switch 30 is a two position switch with its common terminal, which is connected to ground, normally maintained in contact with terminal 35 and momentarily engageable with terminal 36. A series resistor network, including resistors 31 and 32, is interposed between terminal 35, (which terminal is connected to an input of NAND gate 34) and terminal 36 (which terminal is connected to an input of NAND gate 33). The plus V volts high logic level signal is connected between resistors 31 and 32 and maintains at a high logic level whichever input terminal to NAND gates 33 and 34 is not connected to ground through switch 30. The output terminals from both NAND gates 33 and 34 are connected to the remaining input terminal of the other NAND gate (i.e., NAND gates 34 and 33, respectively).

Initialize circuit 23 provides signals for resetting signal up counter 12 and sampling control up counter 15 upon initial activation of circuit 10, and for permitting the resetting of counter reset circuit flip-flops 25 and 26 during normal operation. During normal operation of circuit 10, switch 30 is maintained in contact with terminal 35, thereby grounding an input to NAND gate 34 and forcing the output of NAND gate 34, and an input to NAND gate 33, to a high logic level. Since the other input to NAND gate 33 will be then held at a high logic level by the plus V volts source through resistor 31, the output of NAND gate 33 will be held to a low logic level during normal operation. When circuit 10 is initially activated, switch 30 is momentarily disengaged from terminal 35 and engaged with terminal 36, momentarily reversing the normal operation output logic levels from NAND gates 33 and 34. The precise manner by which these logic levels reset counters 12 and 16 and counter reset circuit 22 shall be denoted hereinbelow.

Having described the construction of circuit 10 and the operation of some of the individual elements therein, an overall operational sequence may now be described. However, in order to more fully understand the concept of and overall operational sequence for the present invention, it is helpful to first view the waveforms depicted in FIGS. 2, 3 and 4 and to consider the mathematical relationship between the high frequency input signal and the output display signal.

Figures 2, 3, 4:
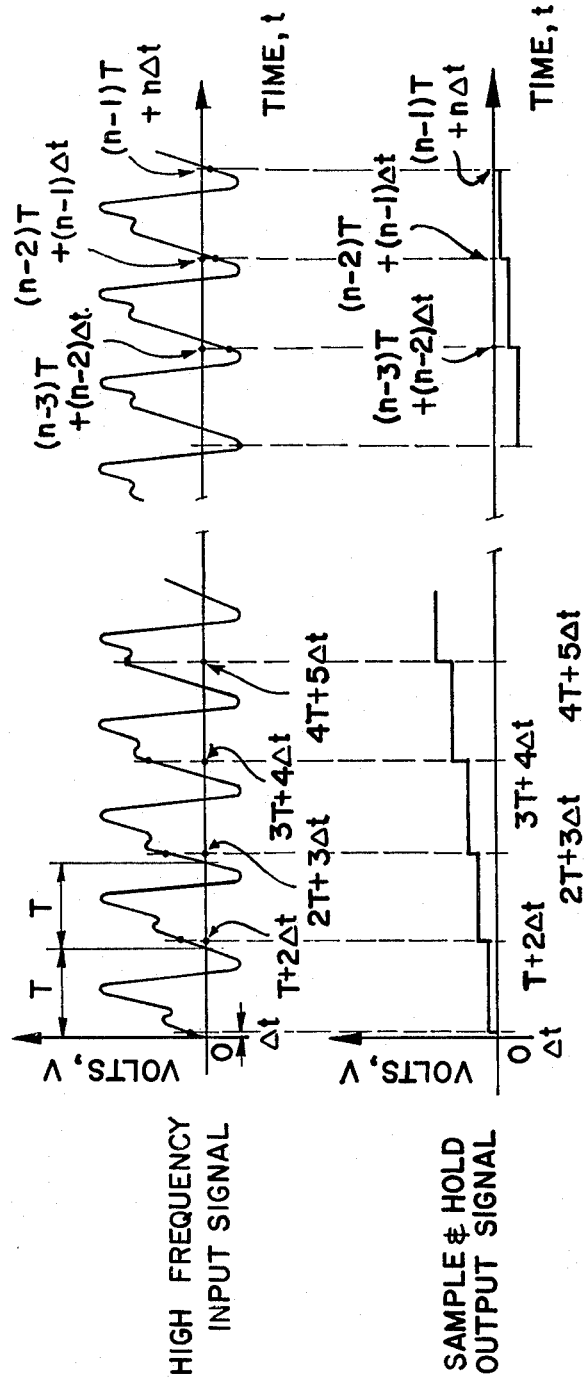
FIG. 2 is a somewhat schematic representation of an arbitrarily shaped high frequency input signal voltage waveform on which the sampling times have been indicated, and although in time coordination with the waveform in FIG. 2, is not otherwise necessarily to scale, or coordinated in time with the waveform in FIG. 4.
FIG. 3 is a somewhat schematic representation of the output signal voltage waveform from the sample and hold circuit, and, although in time coordination with the waveform in FIG. 2, is not otherwise necessarily to scale, or coordinated in time with the waveform in FIG. 4.
FIG. 4 is a somewhat schematic representation of the output display voltage waveform and is not necessarily to scale. The waveform of FIG. 4 is depicted on a much slower (i.e., converted or compressed) time scale than those of FIGS. 2 and 3.

FIG. 2 illustrates an exemplary continuous analog high frequency (and periodic) input signal. Circuit 10 envisions sampling this high frequency input signal once during each period T, at successively increasing intervals. The intervals are increased by a constant time for each successive period, which may be designated by the symbol "$\Delta t$". It follows that the number of sampling points n (each having a duration of $\Delta t$) in each period T equals the number of times the interval $\Delta t$ may be divided into the period T or $$n = T/\Delta t \tag{1}$$

Returning to FIG. 2, it is seen that sampling in the first period after some arbitrarily selected zero crossing occurs at time $\Delta t$. In the second period the sampling occurs at time $T + 2\Delta t$ and so on until the nth period in which sampling occurs at time $(n-1)T + n\Delta t$.

Recalling that the high frequency input signal is sampled only once during each period T, as shown in FIG. 3, it will therefore take sample and hold circuit 20 n periods T to sample a sufficient number of periods to accurately reproduce a single period of the high frequency input signal on output display 21. Since n sampling points will require a period of $(n-1)T + n\Delta t$ seconds, and since the frequency of any signal is equal to the reciprocal of its period, the frequency of the waveform in the output display 21, which may be referred to as the converted frequency, is $$f_{converted} = 1/[(n-1)T + n\Delta t] \tag{2}$$

Expanding the denominator and substituting equation (1) for n, the converted frequency is found to be $$f_{converted} = \Delta t/T^2 \tag{3}$$

For the purpose of an operational description of circuit 10, assume a high frequency input signal of 1 KHz (with a period T of 1 msec.) is to be recorded on a strip chart recorder. With a sampling period $\Delta t$ of 10 $\mu$sec (which has a frequency of 100 KHz), the converted frequency for the waveform in the output display 21 is found from equation (3) to be 10 Hz, within the mechanical response range of most strip chart recorders. Equation (1) indicates 100 sampling points (1 msec/10 $\mu$sec), which at one sample per period T will take 100 periods T, will be required to produce a single period on the strip chart recorder.

Operationally, at the outset switch 30 is momentarily engaged with terminal 36 so that as previously denoted initialize circuit 23 momentarily provides high and low logic level output signals from NAND gates 33 and 34, respectively. The output from NAND gate 33 causes the output from OR gate 27 to go to a high logic level (resetting signal up counter 12), which in turn causes the output from OR gate 28 to go to a high logic level (resetting sampling control up counter 16). During this time the low logic level output from NAND gate 34 will reset both flip-flops 25 and 26 through gate 24, inhibiting the clocking of flip-flops 25 and 26 by the output of OR gate 28.

After initialization is complete, switch 30 is returned to its maintained position in engagement with terminal 35 so that, as previously described, initialize circuit 23 provides low and high logic level output signals from NAND gates 33 and 34, respectively. The high logic level output signal from NAND gate 34 enables AND gate 24, thereafter permitting the resetting of the Q outputs from both flip-flops 25 and 26 to a low logic signal upon receipt of every output pulse from enable one-shot 18.

Upon the occurrence of the first zero crossing of positive slope in the 1 KHz input signal, zero crossing detector and pulse generator 11 provides an output pulse which increments signal up UP counter 12 to a count of one, and, through OR gate 28, resets sampling control up counter 16 and clocks flip-flops 25 and 26. Since the Q output from flip-flop 25 was previously set to a low logic level and its D input is permanently connected to a high logic level, the Q output from flip-flop 25 will go to a high logic level while the Q output from flip-flop 25 will remain at a low logic level. Sampling control clock 15, which controls the sampling rate and therefore operates at a frequency equal to the inverse of the desired sampling period (1/10 $\mu$sec. herein or 100 KHz) and substantially greater than that of the high frequency input signal, rapidly increments sampling control up counter 16 to a count of one. At this time, $\Delta t$ seconds after the occurrence of a first zero crossing, comparator 17 detects an equal count and provides a high logic level output signal to enable one-shot 18, which in turn generates a pulse to cause sample and hold circuit 20 to sample an input parameter, such as voltage magnitude, of the high frequency input signal and hold and provide the sampled value to the output display 21. The pulse output from enable one-shot 18 also resets both the Q outputs from flip-flops 25 and 26 to a low logic level.

Upon detection of the second zero crossing of positive slope in the 1 KHz input signal, zero crossing detector and pulse generator 11 will provide another output pulse incrementing signal up counter 12 to a count of two, and, through OR gate 28, selectively resetting sampling control up counter 16 and clocking flip-flops 25 and 26 so that their respective Q outputs go to high and remain at low logic levels. Next sampling control clock 15 rapidly increments sampling control up counter 16 to a count of two. At this time, $T+2\Delta t$ seconds after the occurrence of the first zero crossing, comparator 17 again detects an equal count, resulting in a second sampling of the high frequency input signal and a resetting of flip-flops 25 and 26 as after the first sampling.

This process will continue with the high frequency input signal being sampled once each period T at multiples of the interval $\Delta t$ until the period following the nth sampling, 101 herein. Since only 100 sampling points may occur in a single period in the example herein, before sampling control up counter 16 may be incremented to a count of 101 to equal that in signal up counter 12, the next zero crossing of positive slope in the 1 KHz input signal is detected and a pulse generated by zero crossing detector and pulse generator 11. This pulse, through OR gate 28, resets sampling control up counter before a count of 101 is reached and clocks both flip-flops 25 and 26. The Q outputs from flip-flops 25 and 26 which were respectively set to high and maintained at low logic levels when the last zero crossing of positive slope was detected, will not have been reset by enable one-shot 18 since no match count will have been reached. As a result, this clocking of flip-flops 25 and 26 will cause the Q output of flip-flop 26 to also go to a high logic level, simultaneously resetting signal up counter 12 through OR gate 27, resetting the sampling control up counter 16 through both OR gates 27 and 28. Since both counters are simultaneously reset, comparator 17 immediately thereafter detects a match count which enables one-shot 18. One-shot 18 in turn immediately and continuously begins another series of 100 samplings by causing sample and hold circuit 20 to sample the desired input parameter and by resetting both flip-flops 25 and 26 through AND gate 24.

Disclosed herein has been a circuit for the real time display of a high frequency periodic signal on a display having a maximum response frequency less than the periodic signal frequency without the need for costly information storage devices. It should be appreciated that the output waveform on output display 21 will appear as a continuous analog signal so long as the sampling control clock 15 frequency remains substantially greater than that of the greatest anticipated high frequency input signal. However, it should be emphasized that the sampling control clock frequency may be variably adjusted to any convenient frequency which results in an output waveform on output display 21 sufficiently proportional to that of the high frequency input signal to satisfy the user.

It should also now be understood that circuit 10 need not include initialize circuit 23 or the logic gates (AND gate 24 and OR gate 27) receiving its outputs in counter reset circuit 22. In such event, depending on the precise time at which circuit 10 is activated relative to the point in the high frequencing input signal, at most two zero crossings will be required before flip-flops 25 and 26 will either be twice consecutively clocked so as to simultaneously reset both counters 12 and 16, or a match count detected by comparator 17, providing a pulse for resetting flip-flops 25 and 26 and sampling control clock 15. In the latter case, circuit 10 will begin sampling at some sampling point within the high frequency input signal. Providing initialization circuit 23 is merely a convenience for insuring circuit 10 begins sampling at the first sampling point in the high frequency input signal.

It should also be noted that in describing the construction and operation of the logic elements within circuit 10, the so-called "positive true logic" convention has been adopted. As would be recognized by a skilled artisan, any other circuits employing a similar or different logic convention could be utilized to implement the desired functions, and when so utilized clearly fall within the scope of the present invention.

Inasmuch as the present invention is subject to many variations, modifications and changes in detail, a number of which have been expressly stated herein, it is intended that all matter described throughout this entire specification or shown in the accompanying drawings be interpreted as illustrative and not in a limiting sense. It should thus be evident that a device constructed according to the concept of the present invention, and reasonably equivalent thereto, will accomplish the objects of the present invention and otherwise substantially improve the art of displaying in real time a high frequency periodic signal on a display having a maximum response frequency less than the periodic signal frequency.

I claim:

1. A circuit for the display of a high frequency periodic signal on a display having a maximum response frequency less than the periodic signal frequency, comprising:

signal period determining means receiving the high frequency periodic signal, and providing an output signal corresponding to the number of periods in the same;

sample and hold means also receiving the high frequency periodic signal and periodically sampling and holding some electrical parameter of the high frequency periodic signal, the display receiving said periodically sampled electrical parameter;

sampling control means counting at a frequency substantially greater than the frequency of the high frequency periodic signal, and providing an output signal corresponding to its present count;

comparator means for continuously comparing said output signal from said signal period determining means and said output signal from said sampling control means, and providing an output signal upon occurrence of a match thereof for enabling a new sample to be taken by said sample and hold means, thereby permitting the display to accurately reproduce the high frequency periodic signal at another frequency in a range of frequencies from zero up to and including the maximum response frequency of the display.

2. A circuit, as set forth in claim 1, wherein said sampling control means includes sampling control clock means for generating a sampling control clock signal having a frequency substantially greater than that of the high frequency periodic signal and for controlling the number of samples that must be taken to accurately reproduce a single period of the high frequency periodic signal on the display, and sampling control counter means receiving the sampling control clock signal and counting from a preselected number each time a sampling control clock signal is received, and providing an output signal corresponding to its present count.

3. A circuit, as set forth in claim 2, wherein said signal period determining means includes signal period counter means and further including counter reset means for selectively resetting said signal period counter means after a sufficient number of samples has been taken to accurately reproduce a single period of the high frequency period signal on the display and for selectively resetting said sampling control counter means after each period in the high frequency periodic signal.

4. A circuit, as set forth in claim 3, wherein said counter reset means includes logic means for determining whether a sufficient number of samples has been taken to accurately reproduce a single period of the high frequency periodic signal on the display and thereupon enable the simultaneous resetting of both said signal period counter means and said sampling control counter means.

5. A circuit, as set forth in claim 4, wherein said logic means includes flip-flop means being clocked by the said signal period determining means upon the occurrence of each period in the high frequency periodic signal and being reset upon the occurrence of a match count by said comparator means, said flip-flop means providing an output signal for simultaneously resetting both said signal period counter means and said sampling control counter means following the last period required for taking a sufficient number of samples to accurately reproduce a single period of the high frequency periodic signal on the display.

6. A circuit, as set forth in claim 5, wherein said flip-flop means includes a first D-type flip-flop having Q output signal and whose input is connected to a fixed logic level signal, and a second D-type flip-flop having a Q output signal whose input receives said Q output signal from said first flip-flop, said Q output signal from said second flip-flop going to such a logic level that would cause simultaneous resetting of both said signal period counter means and said sampling control counter means following the last period required for taking a sufficient number of samples to accurately reproduce a single period of the high frequency period signal on the display, the display including a strip chart recorder and said electrical parameter being voltage magnitude.

7. A circuit, as set forth in claim 6, further including initialize circuit means for providing to said counter reset means at least one output signal of a suitable logic level to cause said counter reset means to reset both said signal period counter means and said sampling control counter means upon initial activation of the circuit.

8. A method for the display of a high frequency periodic signal on a display having a maximum response frequency less than the periodic signal frequency, comprising the steps of:

counting in a signal period counter the number of periods in the high frequency periodic signal;

counting in a sampling control counter at a frequency substantially greater than the frequency of the high frequency periodic signal;

comparing the counts in said signal period counter and said sampling control counter and indicating a match thereof; and sampling some electrical parameter of the high frequency periodic signal when said match count is indicated and holding the same until the next said match count is indicated, and accurately reproducing the high frequency periodic signal at another frequency in a range of frequencies from zero up to and including the maximum response frequency of the display.

9. A method, as set forth in claim 8, wherein said step of counting in a sampling control counter includes the steps of generating a sample control clock signal having a frequency substantially greater than that of the high frequency periodic signal for controlling the number of samples that must be taken to accurately reproduce a single period of the high frequency periodic signal on the display, and counting from a preselected number each time a sample control clock signal is generated.

10. A method, as set forth in claim 9, further including the step of selectively resetting both said signal period counter after a sufficient number of samples has been taken to accurately reproduce a single period of the high frequency periodic signal on the display and said sampling control counter after each period in the high frequency periodic signal.

11. A method, as set forth in claim 10, wherein said step of selectively resetting includes the steps of determining whether a sufficient number of samples has been taken to accurately reproduce a single period of the high frequency periodic signal on the display and thereupon enabling the simultaneous resetting of both said signal period counter and said sampling control counter.

12. A method, as set forth in claim 11, wherein said step of determining whether a sufficient number of samples has been taken includes the steps of clocking a plurality of flip-flops upon the occurrence of each period in the high frequency periodic signal and resetting said plurality of flip-flops upon the indication of said match count, said step of simultaneously resetting both said signal period counter and said sampling control counter occurring following the last period required for taking a sufficient number of samples to accurately reproduce a single period of the high frequency periodic signal on the display, the step of sampling some electrical parameter including the step of sampling a voltage magnitude of the high frequency periodic signal when said match count is indicated and holding the same until the next said match is indicated.

13. A method, as set forth in claim 12, further including the step of initially resetting said signal period counter and said sampling control.

* * * * *